US006563385B2

(12) United States Patent
Wojslaw (10) Patent No.: US 6,563,385 B2
(45) Date of Patent: May 13, 2003

(54) AMPLIFIER BIAS CONTROL CIRCUIT (75) Inventor: Charles Wojslaw, Auburn, CA (US)

(73) Assignee: Xicor, Inc., Milpitas, CA (US)

( * ) Notice: Subject to any disclaimer, the term of this patent is extended or adjusted under 35 U.S.C. 154(b) by 0 days.

(21) Appl. No.: 09/838,531

(22) Filed: Apr. 18, 2001

(65) Prior Publication Data

US 2002/0153956 A1 Oct. 24, 2002

(51) Int. Cl.[7] .................................................. H03F 3/04
(52) U.S. Cl. ........................ 330/296; 330/129; 330/285
(58) Field of Search ................................. 330/129, 285, 330/296, 298

(56) References Cited

U.S. PATENT DOCUMENTS

| 5,670,911 | A | * | 9/1997 | Hori et al. ................... 330/296 |
| 5,724,004 | A | * | 3/1998 | Reif et al. ................... 330/296 |
| 6,028,477 | A | | 2/2000 | Gentzler ...................... 330/149 |
| 6,091,302 | A | * | 7/2000 | Arevalo ....................... 330/296 |
| 6,178,313 | B1 | * | 1/2001 | Mages et al. ................ 330/285 |

FOREIGN PATENT DOCUMENTS

EP          0 996 224 A1    4/2000

* cited by examiner

Primary Examiner—Robert Pascal
Assistant Examiner—Khanh Van Nguyen
(74) Attorney, Agent, or Firm—Fish and Richardson P.C.

(57) ABSTRACT

Methods and apparatus for adjusting DC bias of a radio frequency (RF) amplifier for changing operating conditions such as multiple modulation techniques when no RF is present. A digitally controlled voltage source is programmed to maintain the amplifier bias. The voltage source can be a digitally controlled potentiometer. The amplifier's DC output current can be converted to a voltage and compared to a programmable reference representative of the optimal amplifier bias. The comparator output determines a direction to drive the voltage source. A digital clock is enabled to drive the voltage source when no RF is present. Alternatively, the amplifier's output current can be read by a processor that determines the optimal bias. The bias can be written to a data register that sets the voltage on the voltage source. The system automatically compensates for changes in the amplifier's optimal bias due to aging, temperature, and modulation scheme.

35 Claims, 3 Drawing Sheets

AMPLIFIER BIAS CONTROL CIRCUIT

TECHNICAL FIELD

This invention relates to a method and apparatus for programmably biasing radio frequency amplifiers.

BACKGROUND

In conventional wireless communications systems, a single radio frequency (RF) power amplifier can be used to amplify carrier signals modulated with two or more data modulation techniques. For example, in Global System for Mobile (GSM) communications systems, data can be modulated onto carrier signals using either gaussian minimum shift keying (GMSK) or 8-phase shift keying (8-PSK) modulation techniques. Ideally, the bias point of an RF amplifier is optimized to maximize the amplifier's gain. However, when the same power amplifier is used to amplify carrier signals modulated with two or more data modulation techniques, the amplifier's optimal bias point depends in part upon the type of signal being amplified. For example, the optimum bias point for an amplifier configured to amplify an 8-PSK modulated carrier signal is about ½ the optimum bias point for an amplifier configured to amplify a GMSK modulated carrier signal. Therefore, to optimally bias an RF amplifier configured to amplify carrier signals modulated with two or more data modulation techniques, the bias point needs to be dynamically set depending on how the signal being amplified is modulated.

SUMMARY

In one aspect, the invention provides a digitally controlled voltage source configured to programmably control the bias point of a multi-modulation radio frequency amplifier. The bias point of the radio frequency amplifier is set or adjusted when no radio frequency signal is present at the amplifier gate. The digitally controlled voltage source can be configured as a digitally controlled potentiometer with a buffered wiper output. The buffered wiper output can set the bias point of the amplifier.

Aspects of the invention include can include one or more of the following features. The digitally controlled voltage source can be configured to control the bias point of a multi-modulation RF amplifier in an open loop configuration. The digitally controlled voltage source can be implemented as a digitally controlled potentiometer having a plurality of programmable data registers connected to a wiper counter register. The wiper counter register can control the output potential of a wiper terminal. The plurality of data registers can be pre-programmed to optimally bias the RF amplifier when amplifying signals modulated according to a respective one of a plurality of data modulation techniques. One of the plurality of data registers can be pre-programmed to reverse bias the RF amplifier or to turn the RF amplifier off when no radio frequency signal is present. The digitally controlled potentiometer can be configured to receive control signals to write data to the potentiometer's data registers and to transfer data from any one of the potentiometer's data registers to the wiper counter register. The control signals can be sent to the potentiometer when no RF signal is present at the gate of the amplifier. The wiper counter register can set the wiper terminal to a position where the wiper terminal has an output potential corresponding to one of the preprogrammed optimal bias potentials.

In another aspect, the invention provides a digitally controlled voltage source configured to control the bias point of a multi-modulation radio frequency amplifier in a closed loop configuration having a remote processor control element. Aspects of the invention can include one or more of the following features. The digitally controlled voltage source can be implemented as a digitally controlled potentiometer having a plurality of programmable data registers connected to a wiper counter register. The wiper counter register can control the output potential of a wiper terminal. The DC bias current of the radio frequency amplifier can be converted to a voltage by a current conversion circuit. The current conversion circuit can be implemented as a resistor coupled to an instrumentation amplifier, where the instrumentation amplifier is configured as a current to voltage converter. The sense voltage can be digitized by an analog-to-digital converter and read into a general purpose microprocessor configured to determine the optimal bias point for the amplifier based on the digitized sense voltage. The microprocessor can determine the optimal bias point, and can program the wiper counter register of the digitally controlled potentiometer so that the wiper terminal has an output potential equal to the determined optimum bias point. The microprocessor can program the wiper counter register when no RF signal is present in the amplifier.

In another aspect, the invention provides a digitally controlled voltage source configured to control the bias point of a multi-modulation radio frequency amplifier in a closed loop configuration under local control. Aspects of the invention can include one or more of the following features. The digitally controlled voltage source can be implemented as a digitally controlled potentiometer. The DC bias current of the radio frequency amplifier can be converted to a voltage by a current conversion circuit such as a resistor coupled to an instrumentation amplifier configured as a current to voltage converter. The sensed voltage can be compared to a reference voltage in a comparator configured to output a logic level establishing a direction to drive the potentiometer's wiper terminal. The wiper terminal can be incrementally stepped in the direction established by the comparator logic level on the rising or falling edges of a digital clock. The digital clock can be enabled to move the wiper terminal only when no radio frequency signal is present at the gate of the radio frequency amplifier. The wiper terminal output potential is determined by the wiper terminal position, and is continually adjusted when no radio frequency signal is present to maintain an optimal amplifier bias.

Advantages of the invention include the following. The invention allows for the optimum bias point of a radio frequency amplifier to be programmably controlled. The bias point can be set when no radio frequency signal is present at the amplifier gate. The bias point is can be pre-determined and stored in non-volatile memory. The bias point can be programmably controlled to optimize an amplifier configured to amplify radio frequency signals modulated with a plurality of modulation techniques. The bias point can be programmably controlled to compensate an amplifier for the effects of aging, temperature, humidity, and other environmental factors.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1A:
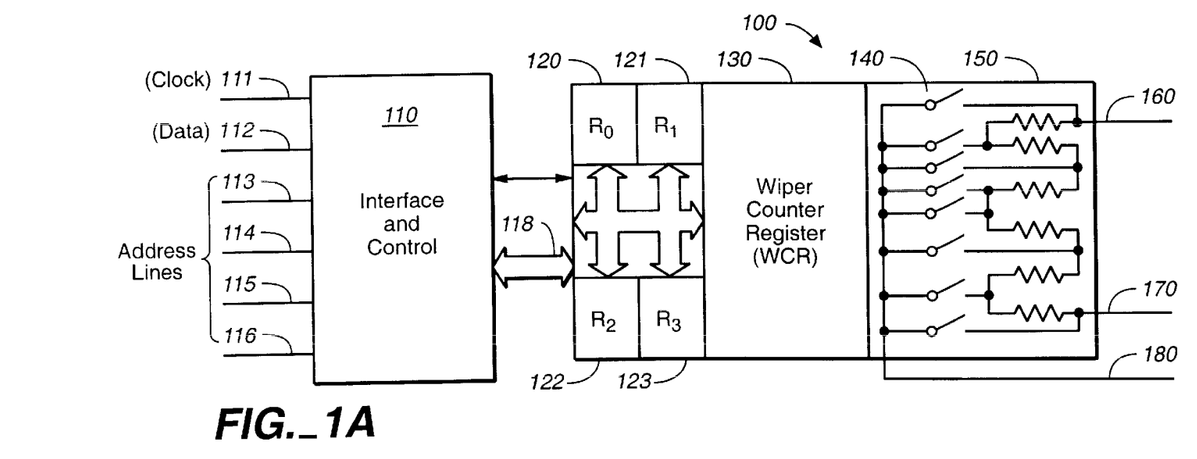
FIG. 1A is a schematic illustration of a digitally controlled potentiometer.

FIGS. 1A shows a schematic of a digitally controlled potentiometer (100). The digitally controlled potentiometer can be configured as a programmable voltage source, and as such becomes a primary component in subsequently disclosed open and closed loop programmable bias controllers. The digitally controlled potentiometer (100) includes an interface and control element (110), connected via a data bus (118) to four data registers (120–123), a wiper counter register (130), a switch array (140), and a resistor array (150) having a high terminal (160), a low terminal (170), and a wiper terminal (180). Each of data registers (120–123), and wiper counter register (130) can be implemented as 8-bit non-volatile data memory elements.

Digitally controlled potentiometer (100) can be controlled by an external device such as a general purpose microprocessor through its interface and control element (110). The interface and control element includes a serial clock line (111), a serial data line (112), and typically four address lines (113–116) which are used to clock data into, out of, or between any two internal registers of digitally controlled potentiometer (100). The instruction set associated with interface and control element (110) allows an external device to read or write data to wiper counter register (130), to read or write data to any of data registers (120–123), to transfer data in either direction between any of data registers (120–123) and wiper counter register (130), and to increment or decrement wiper counter register (130).

The heart of digitally controlled potentiometer (100) is a resistor array (150). One end of resistor array (150) is terminated with a high terminal (160), while the other is terminated with a low terminal (170). When configured as a voltage source, the low (170) and high (160) terminals of digitally controlled potentiometer (100) are connected across a potential difference. A series of switches in a switch array (140) switchably connects wiper terminal (180) to either the low (170) or high (160) terminals of resistor array (150), or to a node between any two resistors in resistor array (150). The switches in switch array (140) are connected to decode logic (not shown) connected to wiper counter register (130). The decode logic is configured to decode the data stored in wiper counter register (130) so that only one of the switches in switch array (140) is closed. For example, when wiper counter register (130) stores a data value n, only the nth switch in switch array (140) is closed. Consequently, wiper terminal (180) sees a voltage divided potential which is a fraction of the potential difference between high terminal (160) and low terminal (170), where the fraction is given by n divided by the number of resistors in resistor array (150).

In one implementation, resistor array (150) is a 255 element array of resistors connected in series, and switch array (140) is implemented with 256 CMOS transistors. The gates of each transistor in switch array (140) are connected to decode logic (not shown) that is connected to wiper counter register (130). The decode logic is configured to decode the data stored in wiper counter register (130) so that only one of the transistors in switch array (140) is biased to conduct. The drain of the first switch in switch array (140) is connected to high terminal (160), the drains of subsequent switches are connected to subsequent nodes between subsequent pairs of resistors in resistor array (150), while the drain of the last switch is connected to low terminal (170). The source of each switch in switch array (140) is connected to wiper terminal (180). When data control register (130) stores a data value n (where $0 \leq n \leq 255$) only the nth switch in switch array (140) is biased to conduct. Consequently, wiper terminal (180) sees a voltage divided potential which is n/255 times the potential difference between high terminal (160) and low terminal (170).

Figure 1B:
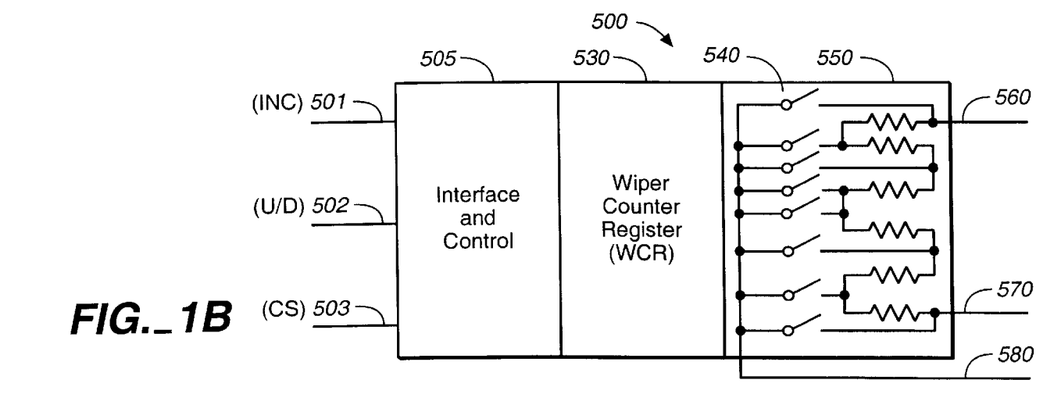
FIG. 1B is a schematic illustration of an alternative implementation of a digitally controlled potentiometer.

An alternative digitally controlled potentiometer (500) is shown in FIG. 1B. Digitally controlled potentiometer (500) has a control element (505), a wiper counter register (530), a switch array (540), and a resistor array (550) having a high terminal (560), a low terminal (570), and a wiper terminal (580). In one implementation, wiper counter register (530) is implemented as an 8-bit non-volatile data memory element. Digitally controlled potentiometer (500) can be controlled by an external device such as a digital clock through interface and control element (505). The interface and control element includes an increment terminal (501), an up/down direction terminal (502), and a chip select terminal (503). Chip select terminal (503) is used to select a potentiometer (500) when more than 1 potentiometers are available. Up/down direction terminal (502) is used to determine a direction to step wiper terminal (580), i.e., toward low terminal (570) or toward high terminal (560). Increment terminal (501) is used to step the wiper terminal (580) in the direction indicated by up/down direction terminal (502).

Further details on digitally controlled potentiometer (100) can be found in U.S. Pat. No. 4,668,932, which is incorporated herein by reference.

Figure 2:
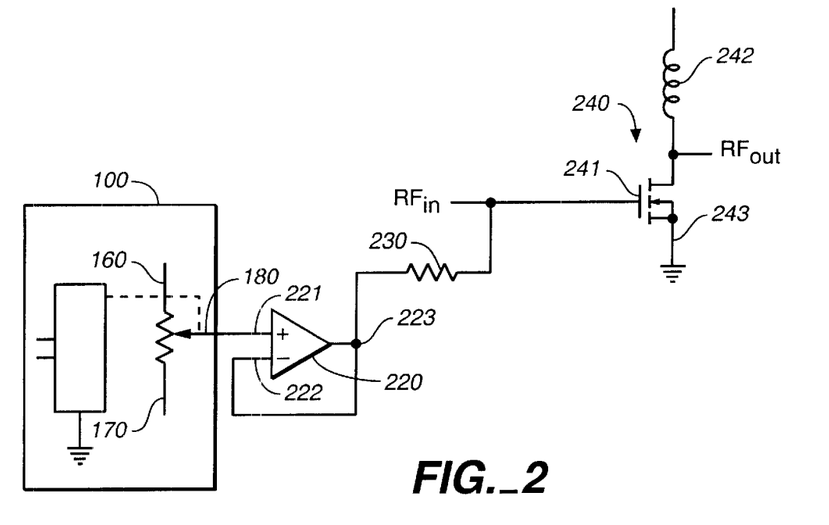
FIG. 2 is a schematic illustration of an open loop programmable bias controller.

Digitally controlled potentiometer (100) can be readily configured to serve as an inexpensive open loop programmable bias controller as shown in FIGS. 1A and 2. In this implementation, digitally controlled potentiometer (100) is configured as a programmable buffered voltage source to bias a radio frequency amplifier (240). The low (170) and high (160) terminals of digitally controlled potentiometer (100) are connected across a potential difference. The voltage of wiper terminal (180) is determined by this potential difference and the contents of wiper counter register (130). The output of wiper terminal (180) is connected to the non-inverting input (221) of operational amplifier (220). The inverting input (222) of operational amplifier (220) is connected to the output (223) of operational amplifier (220). Operational amplifier (220) is thus configured as a unity gain, non-inverting amplifier, and serves to buffer the output voltage of wiper terminal (180). The output (223) of operational amplifier (220) biases the input gate (241) to radio frequency amplifier (240), and is isolated from the radio frequency signal injected into input gate (241) by isolating resistor (230).

Radio frequency amplifier (240) may require a plurality of optimum DC bias points. For example, amplifier (240) may be a multi-modulation radio frequency amplifier requiring different optimal bias points for differently modulated carrier signals. Digitally controlled potentiometer (100) can have its data registers (120–123) pre-programmed with optimal bias points for each modulation scheme based on the pre-determined operating characteristics of radio frequency amplifier (240). The pre-programmed bias points can be sequentially transferred from data registers (120–123) to wiper counter register (130) at a pre-programmed rate by a clock driving serial clock line (111). The contents of wiper counter register (130) will set the position of wiper terminal (180), and hence the potential of wiper terminal (180) to one of the preprogrammed optimal bias points.

Figure 3:
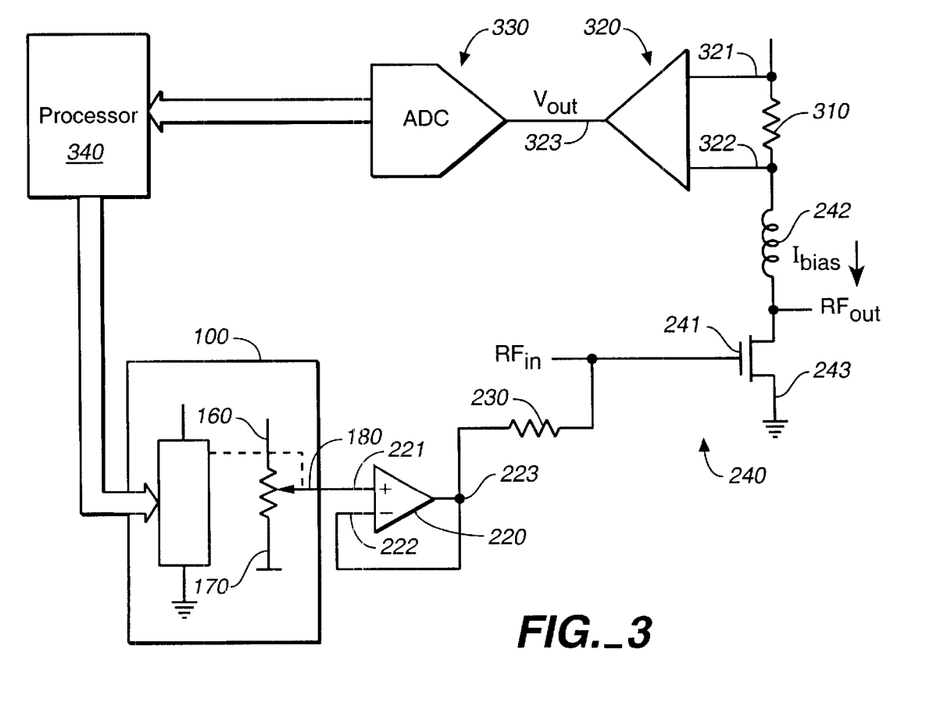
FIG. 3 is a schematic illustration of a closed loop programmable bias controller with a remote processor control element.

In an alternative implementation, as shown in FIGS. 1A and 3, digitally controlled potentiometer (100) can be configured to serve as an inexpensive closed loop programmable bias controller having a remote process control element. In FIGS. 1A and 3, digitally controlled potentiometer (100) is configured as a programmable buffered voltage source to bias radio frequency amplifier (240). As before, the low (170) and high (160) terminals of digitally controlled potentiometer (100) are connected across a potential difference. The voltage of wiper terminal (180) is determined by this potential difference, and by the contents of wiper counter register (130). The output of wiper terminal (180) is connected to the non-inverting input (221) of operational amplifier (220) which is configured as a unity gain, non-inverting amplifier, and serves to buffer the output voltage of wiper terminal (180). The output (223) of operational amplifier (220) biases the input gate (241) of radio frequency amplifier (240), and is isolated from the radio frequency signal injected into input gate (241) by isolating resistor (230).

The DC bias current (242) of radio frequency amplifier (240) may be monitored by measuring the voltage across a series resistor (310) to determine whether the amplifier's gate (241) is biased to optimize the performance of amplifier (240). The terminals of resistor (310) are connected to input terminals (321–322) of an instrumentation amplifier (320) which, together with resistor (310), acts as a current-to-voltage converter. Other current to voltage conversion techniques may be used, as well. For example, resistor (310) and instrumentation amplifier (320) can be replaced with a current mirror circuit. The output (323) of instrumentation amplifier (320) is a voltage that is proportional to the DC bias current of radio frequency amplifier (240). The output voltage (323) of instrumentation amplifier (320) is converted to a digital signal by analog-to-digital (A/D) converter (330) before being written to a general purpose microprocessor (340). Microprocessor (340) is pre-programmed with the performance characteristics of radio frequency amplifier (240), and is configured to determine the optimal bias point for amplifier (240) based on the digitized signal received from A/D converter (330).

Microprocessor (340) can send control signals to interface and control element (110) of potentiometer (100) to write the optimal bias point data to any of the potentiometer's data registers (120–123), or directly to its wiper counter register (130). Alternatively, both digitally controlled potentiometer (100) and microprocessor (340) can be pre-programmed with the performance characteristics of radio frequency amplifier (240), and microprocessor (340) can instruct the appropriate one of the potentiometer's data registers (120–123) to write its contents to wiper counter register (130). Wiper counter register (130) sets the position of wiper terminal (180), thereby controlling the voltage of wiper terminal (180), and the output voltage (223) of buffered amplifier (220), which is used to bias the input gate (241) of radio frequency amplifier (240).

Figure 4A:
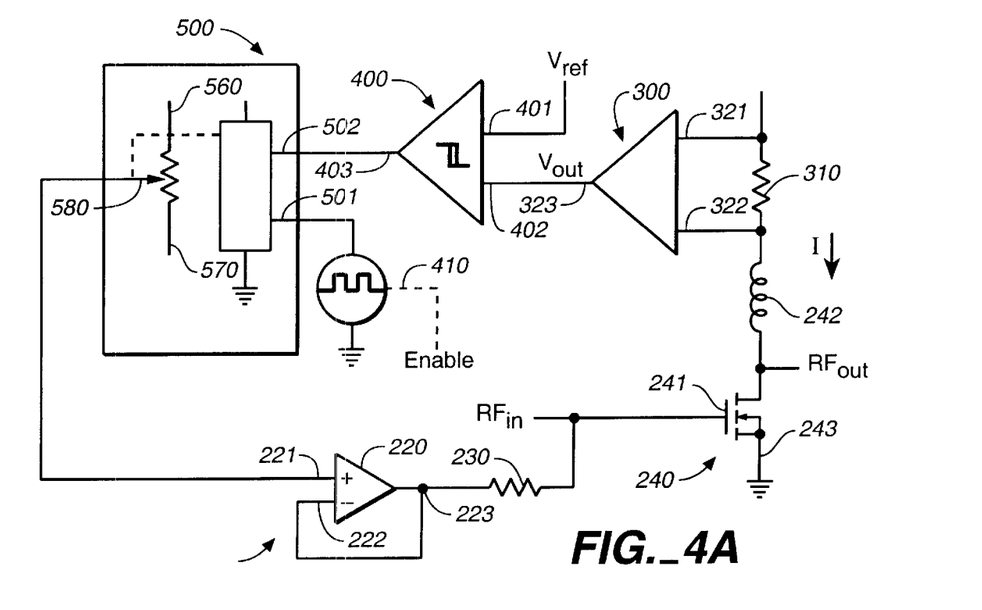
FIG. 4A is a schematic illustration of a closed loop programmable bias controller with local control.

In a third implementation, digitally controlled potentiometer (100) can be configured to serve as an inexpensive closed loop programmable bias controller having local control. As shown in FIGS. 1B and 4A, digitally controlled potentiometer (100) is configured as a programmable buffered voltage source to bias radio frequency amplifier (240). As before, the low (170) and high (160) terminals of digitally controlled potentiometer (100) are connected across a potential difference. The voltage of wiper terminal (180) is determined by this potential difference, and by the contents of wiper counter register (130). The output of wiper terminal (180) is connected to the non-inverting input (221) of operational amplifier (220) which is configured as a unity gain, non-inverting amplifier, and serves to buffer the output voltage of wiper terminal (180). The output (223) of operational amplifier (220) biases the input gate (241) to radio frequency amplifier (240), and is isolated from the radio frequency signal injected into input gate (241) by isolating resistor (230).

The DC bias current (242) of radio frequency amplifier (240) may be monitored by measuring a voltage across a series resistor (310) to determine whether the amplifier's input gate (241) is biased to optimize the performance of amplifier (240). The terminals of resistor (310) are connected to input terminals (321–322) of an instrumentation amplifier (320) which, together with resistor (310), acts as a current-to-voltage converter. As before, other current to voltage conversion techniques, such as a current mirror circuit, may be used in place of resistor (310) and instrumentation amplifier (320). The output (323) of instrumentation amplifier (320) is a voltage that is proportional to the DC bias current of radio frequency amplifier (240). The output voltage (323) of instrumentation amplifier (320) is delivered to one input terminal (402) of a voltage comparator (400). The other input terminal (401) of comparator (400) receives a reference voltage, $V_{ref}$. Voltage comparator (400) outputs a logic level at output terminal (403) which indicates a direction to drive wiper terminal (180) of digitally controlled potentiometer (100).

The logic level output by terminal (403) of comparator (400) is connected to up/down direction terminal (502) of digitally controlled potentiometer (500) and establishes a direction to driver wiper terminal register (530). A digital clock (410) is connected to increment terminal (501) of digitally controlled potentiometer (500) and drives (increments or decrements) wiper counter register (530) in the direction established by the logic level present at up/down direction terminal (502). As wiper counter register (530) is incremented (or decremented), wiper terminal (580) is connected to a different node of resistor array (550) and sees more (or less) of the potential difference between high terminal (560) and low terminal (570). As the potential difference seen by wiper terminal (580) changes, the output (223) of operational amplifier (220) also changes to change the bias at the input gate (241) of radio frequency amplifier (240). When the reference voltage, $V_{ref}$, at input terminal (401) of comparator (400) is set to optimally bias input gate (241) of radio frequency amplifier (240), the circuit described and depicted in FIGS. 1B and 4A maintains the bias at the optimal point.

Digital clock (410) can be enabled or disabled by a system level control signal. The clock is disabled when a radio frequency signal is present at the gate to radio frequency amplifier (240). When digital clock (410) is disabled, the digitally controlled potentiometer (100) holds its current wiper position, thereby maintaining the DC bias point of the radio frequency amplifier at the last known optimum bias point. Digital clock (410) is enabled when no radio frequency signal is present at the gate of radio frequency amplifier (240). When digital clock (410) is enabled, the bias point of radio frequency amplifier (240) is continually adjusted to compensate for changes in the amplifier due to aging, temperature changes, or changes in modulation techniques.

Figure 4B:
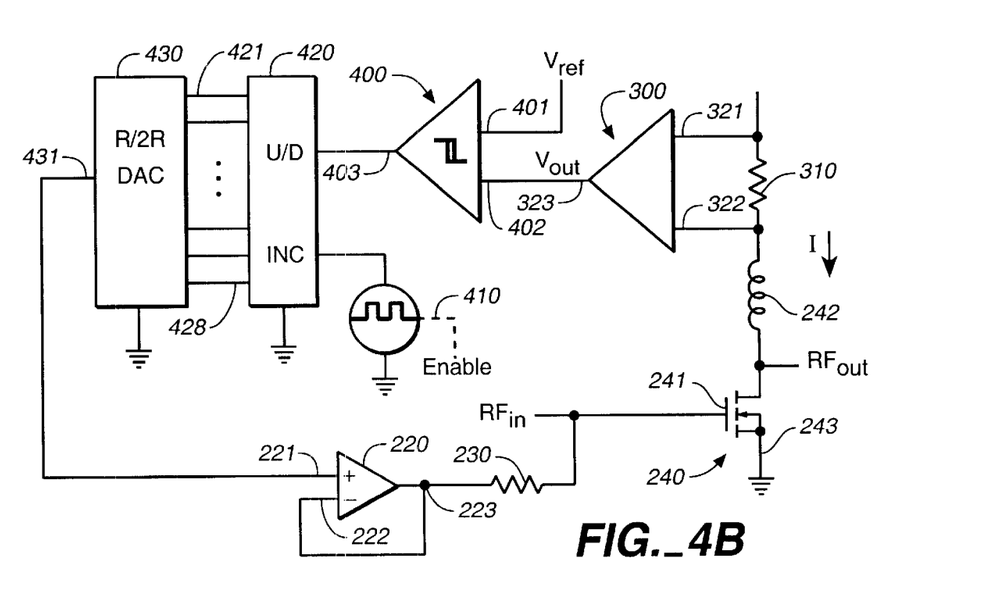
FIG. 4B is a schematic illustration of an alternative implementation of a closed loop programmable bias controller with local control.

An alternative implementation of a closed loop programmable bias controller having local control is shown in FIGS. 1B and 4B. As before, the DC bias current (242) of radio frequency amplifier (240) may be monitored by measuring a voltage across a series resistor (310) to determine whether the radio frequency amplifier's input gate (241) is biased to optimize the performance of radio frequency amplifier (240). The terminals of resistor (310) are connected to input terminals (321–322) of an instrumentation amplifier (320) which, together with resistor (310), acts as a current-to-voltage converter. As before, other current to voltage conversion techniques, such as a current mirror, may be used. The output (323) of instrumentation amplifier (320) is a voltage that is proportional to the DC bias current of radio frequency amplifier (240).

The output voltage (323) of instrumentation amplifier (320) is delivered to one input terminal (402) of a voltage comparator (400). The other input terminal (401) of comparator (400) receives a reference voltage, $V_{ref}$. Voltage comparator (400) outputs a logic level at output terminal (403) which indicates a direction to drive a register (420). In one implementation, register (420) is configured as an 8-bit serial in/parallel out shift register. Other registers, e.g., 10-bit or 12-bit shift registers can be used, however. A digital clock (410) drives register (420) in the direction established by the logic level at output terminal (403) of comparator (400).

The contents of register (420) appear on data lines (421–428). They are input to an R/2R digital-to-analog converter (DAC) (430) connected to a reference potential (not shown). The output (431) of DAC (430) is an analog voltage determined by dividing the reference potential by the binary number stored in register (420). For example, if register (420) stores the binary number 00000100, DAC (430) will output an analog voltage that is ⅛ of the reference potential to which it is connected. The output (431) of DAC (430) is connected to the non-inverting input (221) of operational amplifier (220), causing the amplifier's output (223) to change the bias at the input gate (241) of radio frequency amplifier (240). When the reference voltage, $V_{ref}$, at input terminal (401) of comparator (400) is set to optimally bias input gate (241) of radio frequency amplifier (240), the circuit described and depicted in FIG. 4B maintains the bias at the optimal point.

Digital clock (410) can be enabled or disabled by a system level control signal. The clock is disabled when a radio frequency signal is present at the gate to radio frequency amplifier (240). When digital clock (410) is disabled, register (420) and DAC (430) maintain their current voltage, thereby maintaining the DC bias point of the radio frequency amplifier (240) at the last known optimum bias point. Digital clock (410) is enabled when no radio frequency signal is present at the gate of radio frequency amplifier (240). When digital clock (410) is enabled, the bias point of radio frequency amplifier (240) is continually adjusted to compensate for changes in the amplifier due to aging, temperature changes, or changes in modulation techniques.

A number of embodiments of the invention have been described. Nevertheless, it will be understood that various modifications may be made without departing from the spirit and scope of the invention. For example, while the bias controller circuits have been described as controlling the bias point of a multi-modulation radio frequency amplifier, they can be used to control other devices that have preferred or optimal operating points. The bias control circuits can be used to control bipolar as well as MOSFET amplifiers. They can be configured as current sources rather than voltage sources. They can be used to control for drifts in amplifier bias points due to aging, or changes in environment such as changes in temperature, pressure, or humidity.

While the digitally controlled potentiometer has been described as having a 255 element resistor array, the potentiometer can be implemented with any number of resistors. Similarly, while the switches controlling the wiper terminal have been implemented as CMOS switches, they may be implemented with any type of electronic switch. And while the circuits have been described using a digitally controllable potentiometer as the controllable voltage source, other digitally controllable voltage sources can be used. For example, the digitally controlled potentiometer can be replaced by a register, logic to increment or decrement the contents of the register, and a digital-to-analog converter. These and other embodiments are within the scope of the following claims.

What is claimed is:

1. A closed loop feedback controller configured to drive the bias point of a radio frequency amplifier, comprising:
   a current sensing circuit configured to provide an output signal proportional to the DC bias operating point of the radio frequency amplifier;
   a comparator configured to provide a logic level output by comparing the output signal of the current sensing circuit with a reference level;
   a digital clock configured to provide a sequence of pulses to a digitally controlled voltage source; and
   a digitally controlled voltage source configured to receive the logic level output of the comparator and the sequence of pulses from the digital clock and to drive a voltage output in a direction determined by the logic level output to bias the radio frequency amplifier.

2. The closed loop feedback controller of claim 1, further comprising an operational amplifier configured as a buffer and coupled between the digitally controlled voltage source and a control input terminal of the radio frequency amplifier.

3. The closed loop feedback controller of claim 1, wherein the current sensing circuit further comprises:
   a resistor coupled in series to a drain a power output terminal of the radio frequency amplifier, wherein the resistor is configured to sense the radio frequency amplifier's DC bias operating point; and
   an instrumentation amplifier coupled across the resistor and configured to convert the DC bias operating point sensed by the resistor to an analog voltage.

4. The closed loop feedback controller of claim 1, wherein the reference level is variable and allows the controller to arbitrarily bias the radio frequency amplifier.

5. The controller of claim 4, wherein the reference level is varied to optimally bias the radio frequency amplifier.

6. The controller of claim 4, wherein the reference level is varied to turn the radio frequency amplifier off when no radio frequency signal is present.

7. The controller of claim 4, wherein the reference level is varied to optimally bias the radio frequency amplifier when the radio frequency amplifier is configured to amplify radio frequency signals modulated according to a plurality of data modulation techniques.

8. The controller of claim 4, wherein the reference level is varied to optimally bias the radio frequency amplifier under a plurality of operating conditions based on one or more characteristics of the radio frequency amplifier.

9. The controller of claim 8, wherein the reference level is varied to optimally bias the radio frequency amplifier to correct for changes to the radio frequency amplifier's bias due to effects selected from the group consisting of temperature, pressure, humidity, and aging effects.

10. The controller of claim 1, wherein the digitally controlled clock is enabled when no radio frequency signal is present at a control input terminal of the radio frequency amplifier.

11. The controller of claim 1, wherein the digitally controlled voltage source comprises a digitally controlled potentiometer having a wiper terminal, an up/down direction terminal, and an increment terminal.

12. The controller of claim 1, wherein the digitally controlled voltage source comprises:
increment and decrement control logic;
a register; and
a digital-to-analog converter.

13. A closed loop feedback controller configured to drive the bias point of a radio frequency amplifier, comprising:
a resistor coupled in series to a power output terminal of the radio frequency amplifier, wherein the resistor is configured to sense the amplifier's DC bias operating point;
an instrumentation amplifier coupled in parallel to the resistor and configured to convert the DC bias operating point sensed by the resistor to an analog voltage;
a comparator configured to provide a logic level output by comparing the output of the instrumentation amplifier with a reference level;
a digital clock configured to provide a sequence of pulses to a digitally controlled voltage source; and
a digitally controlled voltage source configured to receive the logic level output of the comparator and the sequence of pulses from the digital clock and to drive a voltage output in a direction determined by the logic level output to bias the radio frequency amplifier.

14. A programmable bias controller for biasing a radio frequency amplifier, comprising a digitally controlled potentiometer having a wiper terminal and a plurality of programmable data registers, wherein each of the plurality of programmable data registers is configured to control a potential of the wiper terminal to programmably bias the radio frequency amplifier.

15. The controller of claim 14, further comprising an operational amplifier configured as a buffer and coupled between the digitally controlled potentiometer and a control input terminal of the radio frequency amplifier.

16. The controller of claim 14, wherein the plurality of programmable data registers comprise non-volatile memory.

17. The controller of claim 14, wherein the plurality of programmable data registers are programmed with a plurality of bias voltages to optimally bias the radio frequency amplifier.

18. The controller of claim 17, wherein the radio frequency amplifier is configured to amplify radio frequency signals modulated with data according to a respective plurality of data modulation techniques.

19. The controller of claim 14, wherein one of the programmable data registers is programmed to turn the radio frequency amplifier off when no radio frequency signal is present.

20. The controller of claim 14, wherein the digitally controlled potentiometer is configured to optimally bias the radio frequency amplifier when no radio frequency signal is present.

21. The controller of claim 14, wherein the plurality of programmable data registers are programmed with a plurality of bias voltages to optimally bias the radio frequency amplifier under a respective plurality of operating conditions based on one or more characteristics of the radio frequency amplifier.

22. The controller of claim 21, wherein the plurality of programmable data registers are programmed with a plurality of bias voltages to optimally bias the radio frequency amplifier to correct for changes to the radio frequency amplifier's bias due to effects selected from the group consisting of temperature, pressure, humidity, and aging effects.

23. A closed loop feedback controller configured to drive the bias point of a radio frequency amplifier, comprising:
a current sensing circuit configured to provide an output signal proportional to a DC bias operating point of the radio frequency amplifier;
an analog-to-digital converter coupled to the current sensing circuit and configured to convert the output signal of the current sensing circuit to a digital signal;
a processor coupled to the analog-to-digital converter and configured to control a digitally controlled voltage source responsive to the digital signal received from the analog-to-digital converter; and
a digitally controlled potentiometer coupled to the processor and having a wiper terminal and a plurality of programmable data registers configured to control a potential of the wiper terminal to programmably bias a control input terminal of the radio frequency amplifier.

24. The controller of claim 23, further comprising an operational amplifier configured as a buffer and coupled between the digitally controlled potentiometer and the control input terminal of the radio frequency amplifier.

25. The controller of claim 23, wherein the current sensing circuit further comprises:
a resistor coupled in series to a power output terminal of the radio frequency amplifier, and configured to sense the radio frequency amplifier's DC bias operating point; and
an instrumentation amplifier coupled across the resistor and configured to convert the DC bias operating point to an analog voltage.

26. The controller of claim 23, wherein the plurality of programmable data registers are programmed with a plurality of bias voltages to optimally bias the radio frequency amplifier.

27. The controller of claim 26, wherein the radio frequency amplifier is configured to amplify radio frequency signals modulated with data according to a respective plurality of data modulation techniques.

28. The controller of claim 23, wherein one of the programmable data registers is programmed to turn the radio frequency amplifier off when no radio frequency signal is present.

29. The controller of claim 23, wherein the digitally controlled potentiometer is configured to set an optimum bias voltage for the radio frequency amplifier when no radio frequency signal is present.

30. The controller of claim 23, wherein the plurality of programmable data registers are programmed with a plurality of bias voltages to optimally bias the radio frequency amplifier under a respective plurality of operating conditions based on one or more characteristics of the radio frequency amplifier.

31. The controller of claim 30, wherein the plurality of programmable data registers are preprogrammed with a plurality of bias voltages to optimally bias the radio frequency amplifier to correct for changes to the radio frequency amplifier's bias due to effects selected from the group consisting of temperature, pressure, humidity, and aging effects.

32. A closed loop feedback controller configured to drive a bias point of a radio frequency amplifier, comprising:

a resistor coupled in series to a power output terminal of the radio frequency amplifier, and configured to sense the radio frequency amplifier's DC bias operating point;

an instrumentation amplifier coupled in parallel to the resistor and configured to convert the DC bias operating point sensed by the resistor to an analog voltage;

an analog-to-digital converter coupled to the instrumentation amplifier and configured to convert the analog voltage output signal of the instrumentation amplifier to a digital signal;

a processor coupled to the analog-to-digital converter and configured to control a digitally controlled voltage source responsive to the digital signal received from the analog-to-digital converter;

a digitally controlled potentiometer coupled to the processor and having a wiper terminal and a plurality of programmable data registers configured to control a potential of the wiper terminal to programmably bias a control input terminal of the radio frequency amplifier; and an operational amplifier configured as a buffer and coupled between the digitally controlled voltage source and the control input terminal of the radio frequency amplifier.

33. A programmable bias controller for biasing a radio frequency amplifier, comprising a digitally controlled voltage source having a plurality of programmable data registers configured to programmably bias the radio frequency amplifier, wherein the digitally controlled voltage source is configured to optimally bias the radio frequency amplifier when no radio frequency signal is present.

34. The controller of claim 33, wherein the plurality of programmable data registers are preprogrammed with a plurality of bias voltages to optimally bias a radio frequency amplifier configure to amplify radio frequency signals modulated with data according to a respective plurality of data modulation techniques.

35. A closed loop feedback controller configured to drive the bias point of a radio frequency amplifier, comprising:

a current sensing circuit configured to provide an output signal proportional to a DC bias operating point of the radio frequency amplifier;

an analog-to-digital converter coupled to the current sensing circuit and configured to convert the output signal of the current sensing circuit to a digital signal;

a processor coupled to the analog-to-digital converter and configured to control a digitally controlled voltage source responsive to the digital signal received from the analog-to-digital converter; and a digitally controlled voltage source coupled to the processor and having a plurality of programmable data registers configured to programmably bias a control input terminal of the radio frequency amplifier, wherein the digitally controlled voltage source is configured to set an optimum bias voltage for the radio frequency amplifier when no radio frequency signal is present.

* * * * *

UNITED STATES PATENT AND TRADEMARK OFFICE
CERTIFICATE OF CORRECTION

PATENT NO. : 6,563,385 B2
DATED : May 13, 2003
INVENTOR(S) : Charles Wojslaw

It is certified that error appears in the above-identified patent and that said Letters Patent is hereby corrected as shown below:

<u>Column 8,</u>
Line 46, please delete "a drain."

Signed and Sealed this

Third Day of February, 2004

JON W. DUDAS
*Acting Director of the United States Patent and Trademark Office*